United States Patent [19]
Inoue

[11] Patent Number: 5,812,447
[45] Date of Patent: Sep. 22, 1998

[54] METHOD AND APPARATUS TO WRITE AND/OR READ TWO TYPES OF DATA FROM MEMORY

[75] Inventor: Takeo Inoue, Hirakata, Japan

[73] Assignee: Sanyo Electric Co., Ltd., Osaka, Japan

[21] Appl. No.: 688,094

[22] Filed: Jul. 29, 1996

[30] Foreign Application Priority Data

Aug. 2, 1995 [JP] Japan ................... 7-197760
Mar. 29, 1996 [JP] Japan ................... 8-076847

[51] Int. Cl.⁶ .............................................. G11C 11/56
[52] U.S. Cl. .............................. 365/168; 365/185.08
[58] Field of Search ........................ 365/45, 185.03; 395/2.38, 2.21, 2.14

[56] References Cited

U.S. PATENT DOCUMENTS

| | | | |
|---|---|---|---|
| 4,318,188 | 3/1982 | Hoffmann | 365/185.03 |
| 4,455,649 | 6/1984 | Esteban et al. | 395/2.38 |
| 4,464,782 | 8/1984 | Beraud et al. | 395/2.38 |
| 4,941,152 | 7/1990 | Medan | 395/2.39 |
| 5,621,682 | 4/1997 | Tanzawa et al. | 365/185.03 |

*Primary Examiner*—David C. Nelms
*Assistant Examiner*—Michael T. Tran
*Attorney, Agent, or Firm*—Beveridge, DeGrandi, Weilacher & Young, L.L.P.

[57] ABSTRACT

The present invention relates to a data write control method for writing at least two types of data to memory. A multi-valued memory to which information composed of two values can be written per cell and information composed of three or more values can be also written per cell is used as the memory. When at least two types of data are written to the multi-valued memory, the amount of information to be written per cell in the multi-valued memory is controlled depending on the type of the data.

38 Claims, 9 Drawing Sheets

METHOD AND APPARATUS TO WRITE AND/OR READ TWO TYPES OF DATA FROM MEMORY

BACKGROUND OF THE INVENTION

1. Field of the Invention

The present invention relates to a data write control method in writing into storing means data such as voice data or video data treated by a message phone, an IC recorder, or the like, a data read control method in reading out the data stored in the storing means, and a data write/read control method.

2. Description of the Prior Art

An equipment which is equipped with a recording device for recording a signal such as an image signal or video signal or a voice signal, a reproducing device for reading out the above-mentioned signal from the recording device and reproducing the signal read out, a recording/reproducing device for recording and reproducing the above-mentioned signal, and the like has recently spread.

FIG. 10 illustrates the construction of a conventional voice recording/reproducing device used in, for example, a message phone which is equipped with an IC memory.

The voice recording/reproducing device comprises coding means 10 for coding a voice signal, a memory 80 for recording coded data found by the coding means 10 and control data required for the voice recording/reproducing device to be normally operated, and decoding means 30 for decoding the coded data read out from the memory 80 to obtain a voice signal.

A binary memory in which only information composed of two values is recorded per cell such as a currently prevailing DRAM (Dynamic RAM) or a currently prevailing SRAM (Static RAM) is used as the memory 80. Examples of the control data include the number of phrases recorded and address information of a memory corresponding thereto.

In the above-mentioned voice recording/reproducing device, a large-capacity memory is required to make recording for a long time possible.

When a multi-valued memory to which information composed of three or more values is written per cell is used as the memory 80, therefore, recording for a long time is possible by a small-capacity memory. If data composed of three or more values is written to or read out from the multi-valued memory, however, it is highly possible that an error occurs in the data, whereby the quality of a voice signal reproduced by the voice recording/reproducing device is degraded, and the voice recording/reproducing device is not normally operated.

SUMMARY OF THE INVENTION

An object of the present invention is to provide a data write control method, a data read control method, and a data write/read control method in which data recording for a long time is possible, and the quality of reproduced data is not degraded.

Another object of the present invention is to provide a data write control method, a data read control method, and a data write/read control method in which data recording for a long time is possible, and a reproducing device is not erroneously operated.

In a data write control method for writing at least two types of data to storing means, a first data write control method according to the present invention is characterized in that the storing means is a multi-valued memory to which information composed of two values can be written per cell and information composed of three or more values per cell can be also written, and the amount of information to be written per cell in the storing means is controlled depending on the type of the data when at least the two types of data are written to the storing means data.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. When the first data and the second data are written to the storing means, the amount of information to be written per cell in the storing means is controlled so that the amount of information, which corresponds to the first data, to be written per cell in the storing means is smaller than the amount of information, which corresponds to the second data, to be written per cell in the storing means.

The above-mentioned two types of data are, for example, a quantized value and a power value of each of band signals obtained when a voice signal is coded by a split band coding (SBC) method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. When the first data and the second data are written to the storing means, the amount of information to be written per cell in the storing means is controlled so that the amount of information, which corresponds to the first data, to be written per cell in the storing means is smaller than the amount of information, which corresponds to the second data, to be written per cell in the storing means.

One of the above-mentioned two types of data is, for example, data to be reproduced, and the other data is, for example, control data. When the data to be reproduced and the control data are written to the storing means, the amount of information to be written per cell in the storing means is controlled so that the amount of information, which corresponds to the control data, to be written per cell in the storing means is smaller than the amount of information, which corresponds to the data to be reproduced, to be written per cell in the storing means.

"Data to be reproduced" refers to non-control data. Examples of the data include data of a voice signal or a video signal, and data obtained by coding the signal.

In a data read control method for reading out from storing means in which at least two types of data are stored the data, a first data read control method according to the present invention is characterized in that the storing means is a multi-valued memory to which information composed of two values can be written per cell and information composed of three or more values can be also written per cell, the two types of data are stored in the storing means so that the amount of information to be written per cell in the storing means differs depending on the type of the data, and the amount of information to be read out per cell in the storing means is controlled depending on the type of the data when the two types of data are read out from the storing means.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. The first data and the second data are written to the storing means so that the amount of information, which corresponds to the first data, to be written per cell in the storing means is smaller than the amount of information, which corresponds to the second data, to be written per cell in the storing means. When the first data and the second data are read out from the storing means, the amount of information to be read out per cell in the storing means is controlled depending on the amount of information, which corresponds to each of the data, to be written per cell in the storing means.

The above-mentioned two types of data are, for example, a quantized value and a power value of each of band signals obtained when a voice signal is coded by a split band coding method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. The first data and the second data are written to the storing means so that the amount of information, which corresponds to the first data, to be written per cell in the storing means is smaller than the amount of information, which corresponds to the second data, to be written per cell in the storing means. When the first data and the second data are read out from the storing means, the amount of information to be read out per cell in the storing means is controlled depending on the amount of information, which corresponds to each of the data, to be written per cell in the storing means.

One of the above-mentioned two types of data is, for example, data to be reproduced, and the other data is, for example, control data. The control data and the data to be reproduced are written to the storing means so that the amount of information, which corresponds to the control data, to be written per cell in the storing means is smaller than the amount of information, which corresponds to the data to be reproduced, to be written per cell in the storing means. When the data to be reproduced and the control data are read out from the storing means, the amount of information to be read out per cell in the storing means is controlled depending on the amount of information, which corresponds to each of the data, to be written per cell in the storing means.

In a data write/read control method for writing at least two types of data to storing means and reading out the types of data from the storing means, a first data write/read control method according to the present invention is characterized in that the storing means is a multi-valued memory to which information composed of two values can be written per cell and information composed of three or more values can be also written per cell, the amount of information to be written per cell in the storing means is controlled depending on the type of the data when the two types of data are written to the storing means, and the amount of information to be read out per cell in the storing means is controlled depending on the type of the data when each of the types of data is read out from the storing means in which the types of data are written.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. When the first data and the second data are written to the storing means, the amount of information to be written per cell in the storing means is controlled so that the amount of information, which corresponds to the first data, to be written per cell in the storing means is smaller than the amount of information, which corresponds to the second data, to be written per cell in the storing means. When the first data and the second data are read out from the storing means, the amount of information to be read out per cell in the storing means is controlled depending on the amount of information, which corresponds to each of the data, to be written per cell in the storing means.

The above-mentioned two types of data are, for example, a quantized value and a power value of each of band signals obtained when a voice signal is coded by a split band coding method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. When the first data and the second data are written to the storing means, the amount of information to be written per cell in the storing means is controlled so that the amount of information, which corresponds to the first data, to be written per cell in the storing means is smaller than the amount of information, which corresponds to the second data, to be written per cell in the storing means. When the first data and the second data are read out from the storing means, the amount of information to be read out per cell in the storing means is controlled depending on the amount of information, which corresponds to each of the data, to be written per cell in the storing means.

One of the above-mentioned two types of data is, for example, data to be reproduced, and the other data is, for example, control data. When the data to be reproduced and the control data are written to the storing means, the amount of information to be written per cell in the storing means is controlled so that the amount of information, which corresponds to the control data, to be written per cell in the storing means is smaller than the amount of information, which corresponds to the data to be reproduced, to be written per cell in the storing means. When the data to be reproduced and the control data are read out from the storing means, the amount of information to be read out per cell in the storing means is controlled depending on the amount of information, which corresponds to each of the data, to be written per cell in the storing means.

In a data write control method for writing at least two types of data to storing means, a second data write control method according to the present invention is characterized in that the storing means comprises a multi-valued memory to which information composed of three or more values is written per cell and a binary memory to which information composed of two values is written per cell, and the multi-valued memory and the binary memory are selected depending on the type of the data when the two types of data are written to the storing means.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. The binary memory is selected when the first data is written to the storing means, and the multi-valued memory is selected when the second data is written to the storing means.

The above-mentioned two types of data are, for example, a quantized value and a power value of each of band signals obtained when a voice signal is coded by a split band coding method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. The binary memory is selected when the first data is written to the storing means, and the multi-valued memory is selected when the second data is written to the storing means.

One of the above-mentioned two types of data is, for example, data to be reproduced, and the other data is, for example, control data. The multi-valued memory is selected when the data to be reproduced is written to the storing means, and the binary memory is selected when the control data is written to the storing means.

In a data read control method for reading out at least two types of data written to storing means, a second data read control method according to the present invention is characterized in that the storing means comprises a multi-valued memory to which information composed of three or more values is written per cell and a binary memory to which information composed of two values is written per cell, and the multi-valued memory and the binary memory are selected depending on the type of the data when the two types of data are read out from the storing means.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. The second data is written to the multi-valued memory, and the first data is written to the binary memory. The binary memory is selected when the first data is read out from the storing means, and the multi-valued memory is selected when the second data is read out from the storing means.

The above-mentioned two types of data are, for example, a quantized value and a power value of each of band signals obtained when a voice signal is coded by a split band coding method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. The second data is written to the multi-valued memory, and the first data is written to the binary memory. The binary memory is selected when the first data is read out from the storing means, and the multi-valued memory is selected when the second data is read out from the storing means.

One of the two types of data is, for example, data to be reproduced, and the other data is, for example, control data. The data to be reproduced is written to the multi-valued memory, and the control data is written to the binary memory. The multi-valued memory is selected when the data to be reproduced is read out from the storing means, and the binary memory is selected when the control data is read out from the storing means.

In a data write/read control method for writing at least two types of data to storing means and reading out the types of data from the storing means, a second data write/read control method according to the present invention is characterized in that the storing means comprises a multi-valued memory to which information composed of three or more values is written per cell and a binary memory to which information composed of two values is written per cell, the multi-valued memory and the binary memory are selected depending on the type of the data when at least the two types of data are written to the storing means, and the multi-valued memory and the binary memory are selected depending on the type of the data when each of the types of data is read out from the storing means in which the types of data are written.

The above-mentioned two types of data are, for example, data required to obtain a predetermined reproduced signal. First data which is one of the two types of data is data having the high possibility that the quality of the reproduced signal is degraded when an error occurs therein, and second data which is the other of the two types of data is data having the low possibility that the quality of the reproduced signal is degraded when an error occurs therein. The binary memory is selected when the first data is written to the storing means, and the multi-valued memory is selected when the second data is written to the storing means. The binary memory is selected when the first data is read out from the storing means, and the multi-valued memory is selected when the second data is read out from the storing means.

The above-mentioned two types of data are, for example, a quantized value and a power value of each of band signals obtained when a voice signal is coded by a split band coding method. The first data is the power value of the band signal, and the second data is the quantized value of the band signal.

The above-mentioned two types of data are, for example, data required to obtain a predetermined reproduced signal in a signal reproducing device. First data which is one of the two types of data is data having the high possibility that the signal reproducing device is erroneously operated when an error occurs therein, and second data which is the other of the two types of data is data having the low possibility that the signal reproducing device is erroneously operated when an error occurs therein. The binary memory is selected when the first data is written to the storing means, and the multi-valued memory is selected when the second data is written to the storing means. The binary memory is selected when the first data is read out from the storing means, and the multi-valued memory is selected when the second data is read out from the storing means.

One of the above-mentioned two types of data is, for example, data to be reproduced, and the other data is, for example, control data. The multi-valued memory is selected when the data to be reproduced is written to the storing means, and the binary memory is selected when the control data is written to the storing means. The multi-valued memory is selected when the data to be reproduced is read out from the storing means, and the binary memory is selected when the control data is read out from the storing means.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Referring now to FIGS. 1 to 9, embodiments of the present invention will be described.

Referring to FIGS. 1 to 4, description is now made of a first embodiment of the present invention.

Figure 1:
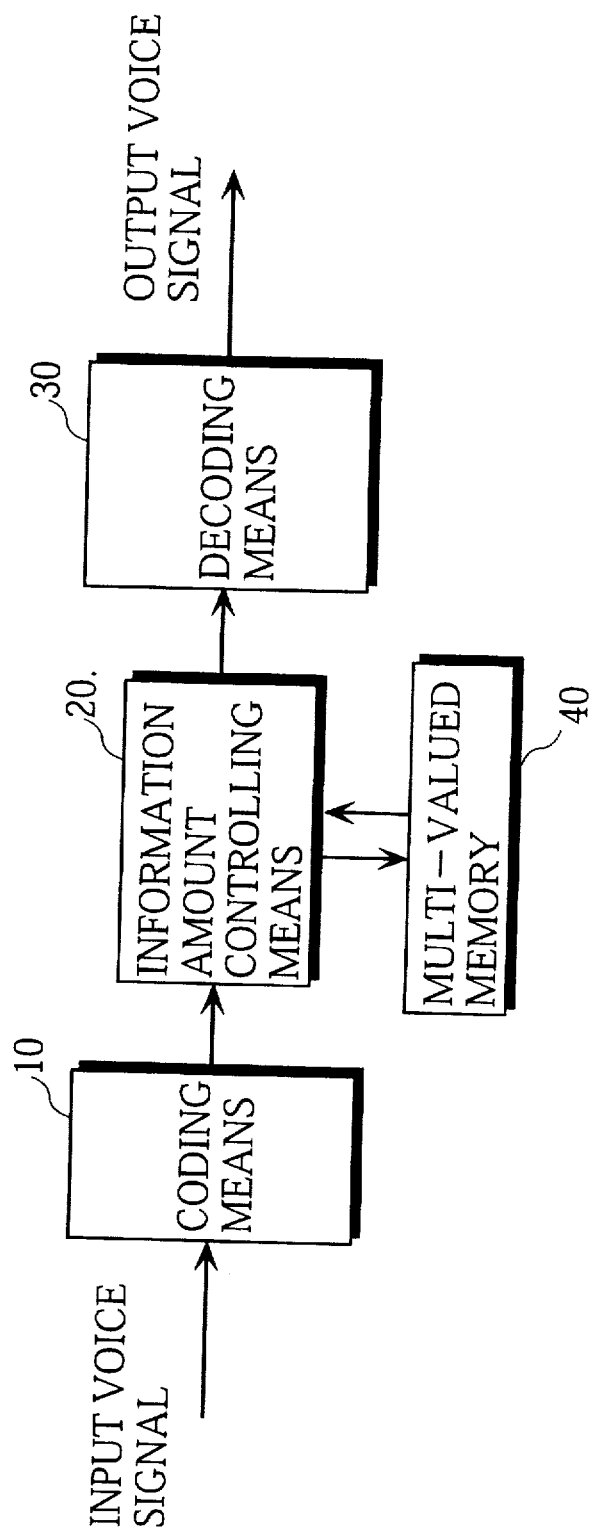
FIG. 1 is a block diagram showing the schematic construction of a voice recording/reproducing device.

FIG. 1 is a diagram showing the schematic construction of a voice recording/reproducing device.

The voice reproducing/recording device comprises coding means 10, information amount controlling means 20, a multi-valued memory 40, and decoding means 30. The multi-valued memory 40 is a memory to which information composed of two values (one bit) per cell can be written and information composed of three or more values can be also written. Examples of the multi-valued memory 40 include an EEPROM (Electrically Erasable and Programmable Read Only Memory) and a flash memory.

An input voice signal is coded by the coding means 10. In this case, a plurality of types of coded data are obtained. There are various types of coded data depending on how coding is carried out by the coding means 10. Examples of the coded data include a quantized value, a power value, an LPC coefficient, pitch period, and an index of a codebook of a residual signal.

The information amount controlling means 20 determines the amount of information to be written per cell in the multi-valued memory 40 depending on the type of the coded data obtained by the coding means 10, and writes each of the types of coded data to the multi-valued memory 40 on the basis of the determined amount of information written.

When each of the types of coded data is read out from the multi-valued memory 40, the information amount controlling means 20 reads out the same amount of information as the amount of information to be written per cell in the multi-valued memory in a case where the coded data is written thereto. The coded data read out is decoded by the decoding means 30. Consequently, an output voice signal is obtained.

When the data having the low possibilities that the quality of a reproduced signal obtained by the voice recording/reproducing device is degraded and the voice recording/reproduce device is erroneously operated when an error occurs therein out of the coded data is written to the multi-valued memory 40, the amount of information to be written per cell in the multi-valued memory is set to four values (two bits), for example.

On the other hand, when the data having the high possibilities that the quality of the reproduced signal is degraded and the voice recording/reproducing device is erroneously operated when an error occurs therein out of the coded data is written to the multi-valued memory 40, the amount of information to be written per cell in the multi-valued memory is set to two values (one bit), for example.

Figure 2:
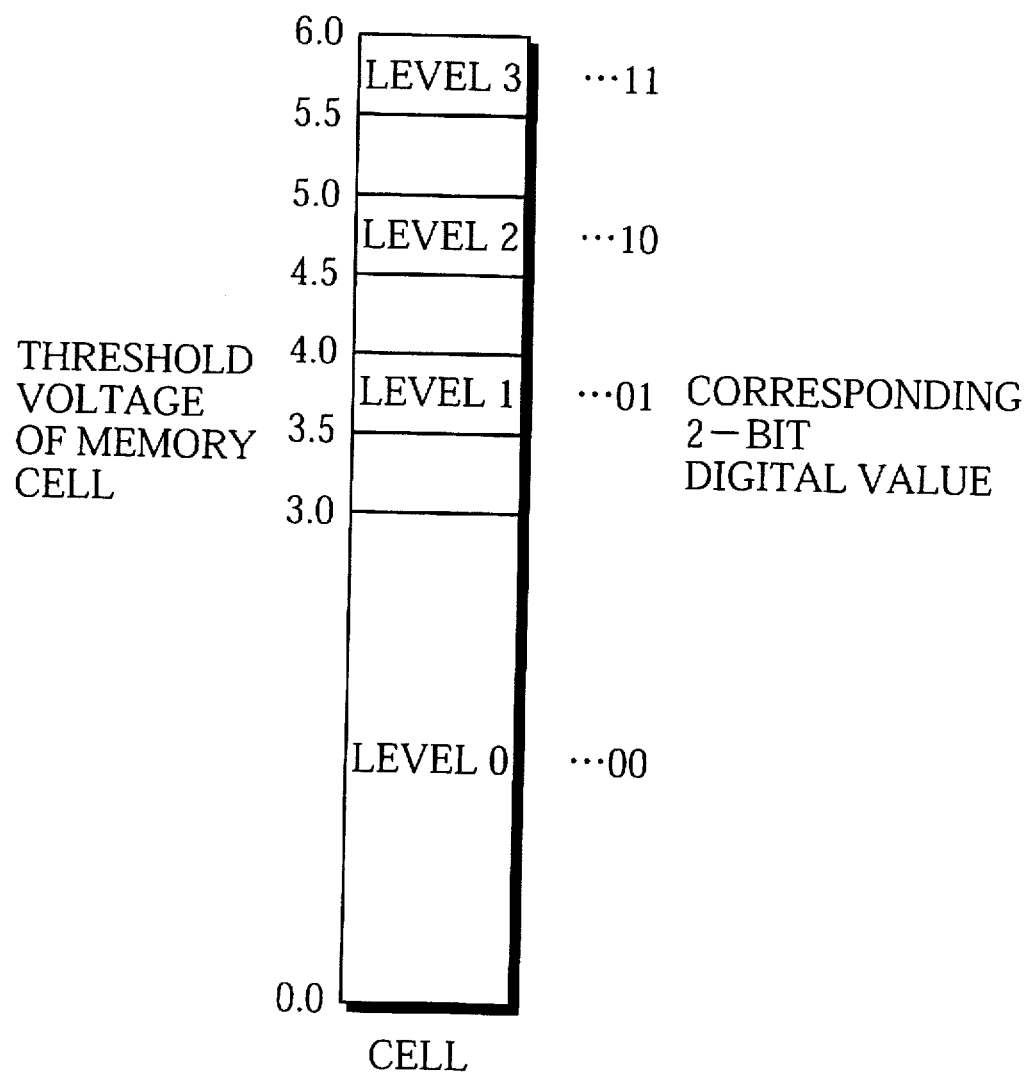
FIG. 2 is a typical diagram showing the relationship between the level of a memory cell and a threshold voltage.

FIG. 2 is a method of assigning four values in a case where information composed of four values (two bits) is recorded in one cell in the multi-valued memory 40.

This example illustrates a case where four levels are assigned to threshold voltages 0 to 6 [V] of the memory cell. The level 0, the level 1, the level 2, and the level 3 are respectively assigned to 3.0 V or less, 3.5 to 4.0 V, 4.5 to 5.0 V, and 5.5 to 6.0 V.

Figure 3:
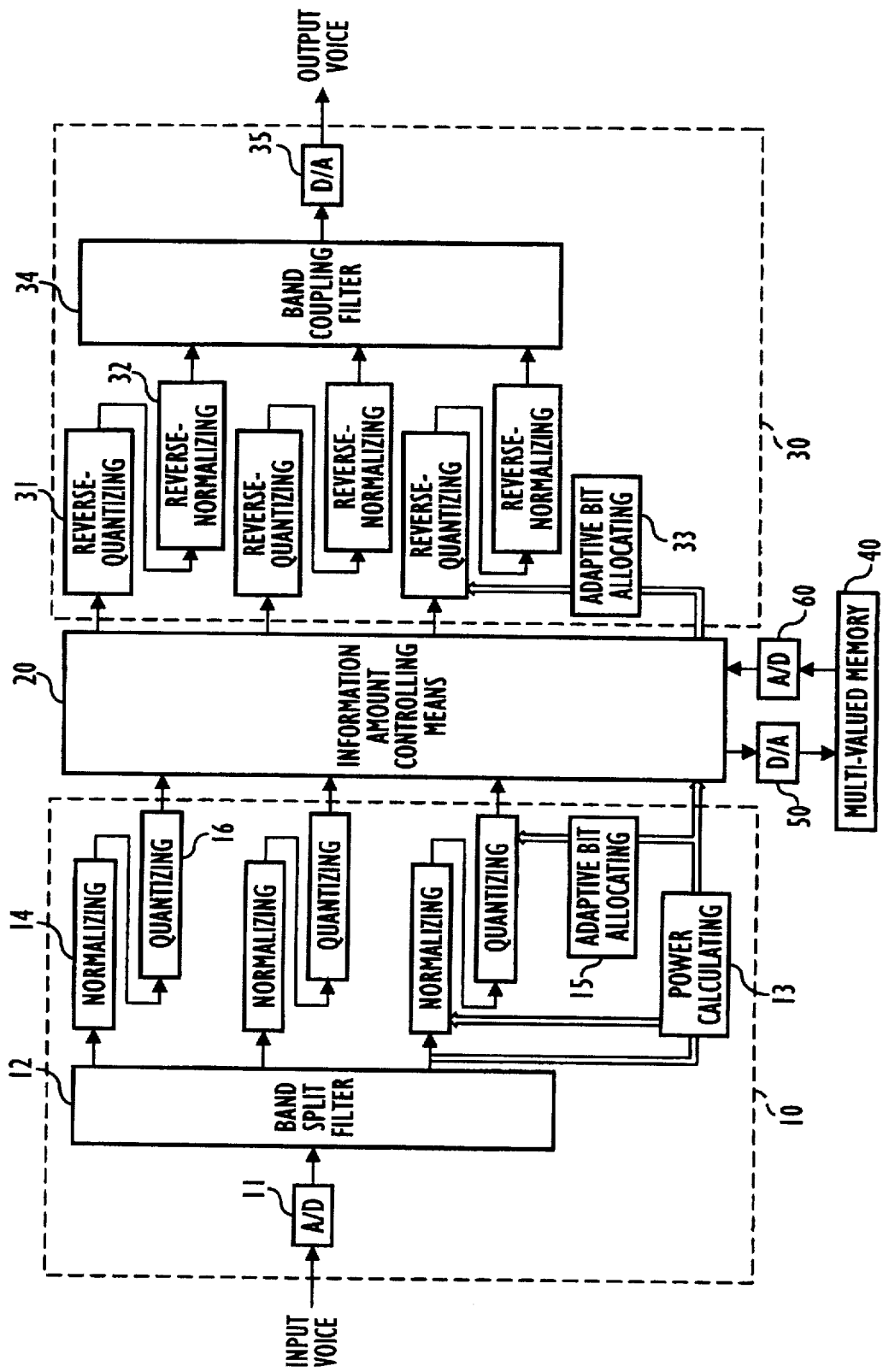
FIG. 3 is a block diagram showing the specific construction of the voice recording/reproducing device shown in FIG. 1.

FIG. 3 illustrates the construction of a voice recording/reproducing device in which a split band coding (SBC) method is employed as a voice coding method.

In the coding means 10, an analog voice signal is first converted into a digital voice signal by an analog-to-digital (A/D) converter 11. The obtained digital voice signal is divided into voice signals in three bands (for example, 0 to 1 kHz, 1 to 2 kHz, and 2 to 3 kHz) by a band split filter 12.

Figure 4:
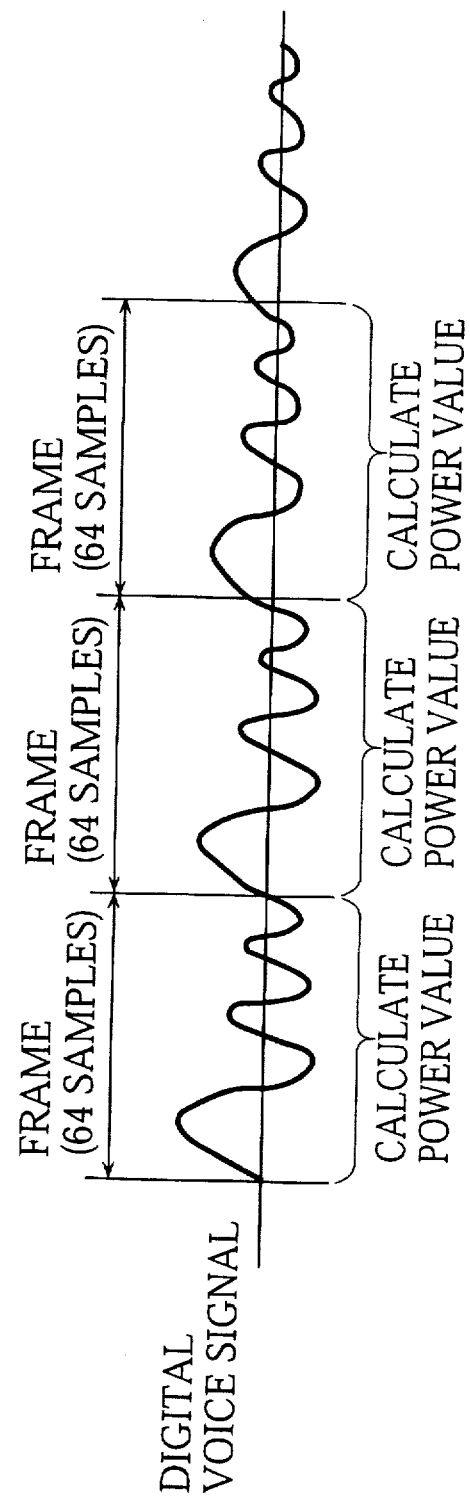
FIG. 4 is a diagram showing a digital voice signal which is divided into frame units.

The voice signal in each of the bands is then divided into frame units each composed of 64 samples, for example, as shown in FIG. 4, and a power value in each of the frame units is found by power calculating means 13. Normalizing means 14 normalizes on the basis of the power value in each of the frame units constituting the voice signal in the band the voice signal in the band for each frame unit.

Adaptive bit allocating means 15 finds the number of bits in quantizing on the basis of the power value in each of the frame units constituting the voice signal in the band the voice signal in the band. Quantizing means 16 quantizes the voice signal in the band on the basis of the number of bits found by the adaptive bit allocating means 15. A quantized value and a power value of the voice signal in the band are sent to the information amount controlling means 20.

When the quantized value of the voice signal in each of the bands is written to the multi-valued memory 40, the information amount controlling means 20 sends the quantized value of the voice signal in the band to a digital-to-analog (D/A) converter 50 in units of two bits ("00", "01", "10" and "11"). A binary value in the unit of two bits is converted into any one of the voltages at the levels 0 to 3 shown in FIG. 2, and a voltage of a cell in which the binary value in the unit of two bits is to be stored in the multi-valued memory 40 is held at the obtained voltage value.

For example, the quantized value of the voice signal in the first band shall be a 6-bit signal "010110", the quantized value of the voice signal in the second band shall be a 4-bit signal "1011", and the quantized value of the voice signal in the third band shall be a 2-bit signal "01".

When the quantized value of the voice signal in the first band is written to the multi-valued memory 40, the 6-bit quantized value "010110" is partitioned in units of two bits, that is, "01", "01" and "10", and values in the units of two bits are sent to the D/A converter 50. The values in the units of two bits are respectively stored in different cells. When the 6-bit quantized value is written to the multi-valued memory 40, therefore, three cells are required.

When the quantized value of the voice signal in the second band is written to the multi-valued memory 40, the 4-bit quantized value "1011" is partitioned in units of two bits, that is, "10" and "11", and values in the units of two bits are sent to the D/A converter 50. The values in the units of two bits are respectively stored in different cells. When the 4-bit quantized value is written to the multi-valued memory 40, therefore, two cells are required.

When the quantized value of the voice signal in the third band written to the multi-valued memory 40, the 2-bit quantized value "01" is sent to the D/A converter 50 as it is. When the 2-bit quantized value is written to the multi-valued memory 40, therefore, one cell is required.

When the power value of the voice signal in each of the bands is written to the multi-valued memory 40, the information amount controlling means 20 format-converts data composed of each of bits composing the power value of the voice signal in the band into 2-bit data in accordance with a rule shown in Table 1, and then sends the obtained 2-bit data to the D/A converter 50. The 2-bit data is converted into the voltage at either one of the level 0 and the level 3 shown in FIG. 2, and a voltage of a cell in which the 2-bit data is to be stored in the multi-valued memory 40 is held at the obtained voltage value.

TABLE 1

| 1-bit data | → | 2-bit data |
|---|---|---|
| 0 | | 00 (level 0) |
| 1 | | 11 (level 3) |

For example, it is assumed that the power value of the voice signal in a certain band is a 4-bit signal "0111". In this case, when the power value is written to the multi-valued memory 40, data composed of bits composing the 4-bit power value "0111", that is, "0", "1", "1" and "1" are respectively converted into 2-bit data in accordance with the rule shown in Table 1. That is, the data "0" and the data "1" are respectively converted into 2-bit data "00" and 2-bit data "11".

The obtained 2-bit data "00", "11", "11" and "11" are sent to the D/A converter 50. The 2-bit data are respectively stored in different cells. When the 4-bit power value is written to the multi-valued memory 40, therefore, four cells are required.

When the quantized value of each of the band signals is read out from the multi-valued memory 40, the voltage at any one of the read levels 0 to 3 is returned to 2-bit digital data by an A/D converter 60. The obtained 2-bit digital data is sent to the decoding means 30.

When the power value of each of the band signals is read out from the multi-valued memory 40, the voltage at any one of the read levels 0 to 3 is converted into 2-bit digital data by the A/D converter 60. The obtained 2-bit digital data is format-converted into 1-bit data in accordance with a rule shown in Table 2. The obtained 1-bit digital data is sent to the decoding means 30.

TABLE 2

| 2-bit data | → | 1-bit data |
|---|---|---|
| 00 (level 0) | | 0 |
| 01 (level 1) | | |
| 10 (level 2) | | 1 |
| 11 (level 3) | | |

In the decoding means 30, an operation quite opposite to the operation performed by the coding means 10 is performed. Specifically, the power value read out from the multi-valued memory 40 by the information amount controlling means 20 is sent to adaptive bit allocating means 33. The adaptive bit allocating means 33 finds the number of quantized bits for quantizing the voice signal in each of the bands on the basis of the sent power value.

The quantized value of the band signal read out from the multi-valued memory 40 is sent to reverse-quantizing means 31. The reverse-quantizing means 31 reverse-quantizes the sent quantized value of the band signal depending on the number of bits found by the adaptive bit allocating means 33.

Each of the band signals obtained by the reverse-quantizing means 31 is reverse-normalized by reverse-normalizing means 32, and is then sent to a band coupling filter 34. The band coupling filter 34 couples three band signals. A digital signal obtained by the band coupling filter 34 is converted into an analog voice signal by a D/A converter 35.

In the above-mentioned embodiment, examples of the coded data to be written to the multi-valued memory 40 include two types of data, that is, the quantized value and the power value of each of the band signals. Even when a slight error occurs in the quantized value of the band signal, the quality of the reproduced signal is not degraded. On the other hand, when an error occurs in the power value of the band signal, the quality of the reproduced signal is degraded, whereby correct voice cannot be reproduced.

Therefore, the quantized value of each of the band signals, which is such data that the quality of the reproduced signal is not degraded even when a slight error occurs therein, is written to the multi-valued memory every two bits per cell in the memory. On the other hand, the power value of each of the band signals, which is such data that the quality of the reproduced signal is degraded if an error occurs therein, is written to the multi-valued memory for each bit per cell in the memory.

When the coded data is read out from the multi-valued memory 40, the quantized value of the band signal is read out every two bits per cell in the memory, and the power value of the band signal is read out for each bit per cell in the memory.

As described in the foregoing, in the above-mentioned first embodiment, the data having the low possibility that the quality of the reproduced signal is degraded when an error occurs therein out of the coded data is stored every three or more values per cell in the memory in order to save the memory capacity. On the other hand, the data having the high possibility that the quality of the reproduced signal is degraded when an error occurs therein is stored every two values per cell in the memory in order to make it possible to correctly perform reading and writing from and to the memory. According to the above-mentioned first embodiment, therefore, recording for a long time is possible with a small memory capacity. Moreover, in the voice recording/reproducing device, the quality of the reproduced signal is not changed.

Furthermore, the information amount controlling means 20 format-converts the data which is the power value, as described above. Even if the number of quantized bits of the D/A converter 50 and the A/D converter 60 remains fixed to two bits, therefore, 2-bit data can be read and written per cell in the memory, and 1-bit data can be read and written per cell in the memory.

[2] Description of Second Embodiment

Figure 5:
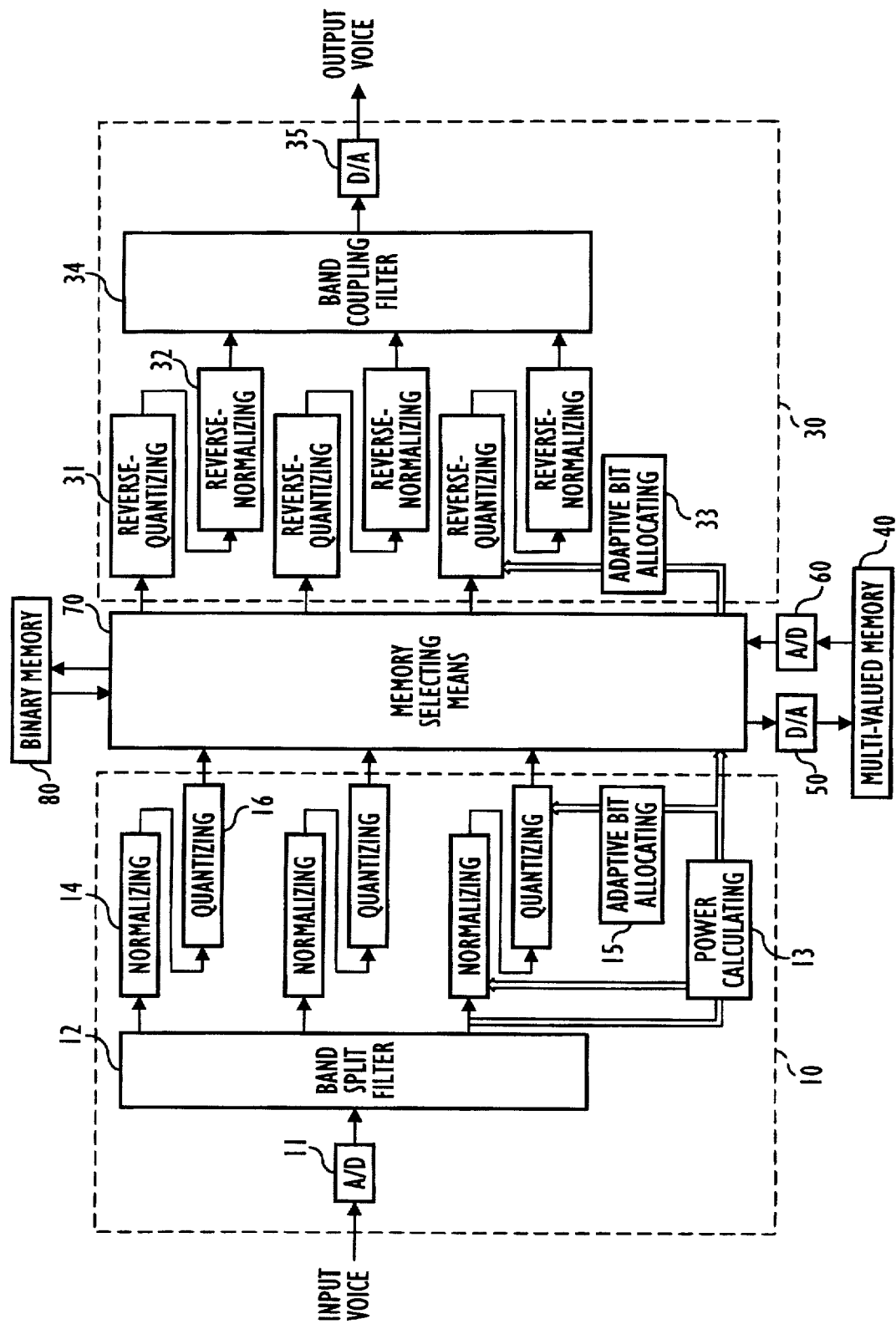
FIG. 5 is a diagram showing the construction of another voice recording/reproducing device.

Referring to FIG. 5, a second embodiment of the present invention will be described.

FIG. 5 illustrates the construction of a voice recording/reproducing device. In FIG. 5, the same sections as those shown in FIG. 3 are assigned to the same reference numerals and hence, the description thereof is not repeated.

In the voice recording/reproducing device, a binary memory 80 is provided in addition to a multi-valued memory 40. The binary memory 80 is a memory to which information composed of only two values is written per cell. As the binary memory, a DRAM, a SRAM, and/or the like is generally used. An EEPROM, a flash memory, or the like may be used in such a shape that only two values are read and written.

An input voice signal is coded by coding means 10. A quantized value and a power value of each of the band signals are found as coded data. The quantized value and the power value of each of the band signals are inputted to memory selecting means 70.

In a case where the power value which is data having the high possibility that the quality of a reproduced signal obtained by the voice recording/reproducing device is degraded when an error occurs therein is recorded, the memory selecting means 70 selects the binary memory 80 as a memory storing the data. Consequently, the power value is written to the binary memory 80 every two values (one bit) per cell.

On the other hand, in a case where the quantized value which is data having the low possibility that the quality of the reproduced signal is degraded even when an error occurs therein, the memory selecting means 70 selects the multi-valued memory 40 as a memory storing the data. Consequently, the quantized value is written to the multi-valued memory 40 every four values (two bits) per cell.

An operation performed by the memory selecting means 70 in a case where the quantized value is written to the multi-valued memory 40 is the same as the operation performed by the information amount controlling means 20 in the first embodiment. Specifically, the quantized value of each of the band signals is sent to a D/A converter 50 in units of two bits ("00", "01", "10" and "11"). A binary value in the unit of two bits is converted into the voltage in any one of the levels 0 to 3 shown in FIG. 2, and a voltage of a cell in which the binary value in the unit of 2 bits is to be stored in the multi-valued memory 40 is held at the obtained voltage value.

When the power value is read out, the binary memory 80 is selected by the memory selecting means 70, whereby digital data composed of two values per cell is read out from the binary memory 80. When the quantized value is read out, the multi-valued memory 40 is selected by the memory selecting means 70. The voltage at any one of the levels 0 to 3 read out from the multi-valued memory 40 is returned to 2-bit digital data by an A/D converter 60.

As described in the foregoing, in the above-mentioned second embodiment, the data having the low possibility that the quality of the reproduced signal is degraded when an error occurs therein out of the coded data is stored in the multi-valued memory 40 every three or more values per cell in the memory in order to save the memory capacity. On the other hand, the data having the high possibility that the quality of the reproduced signal is degraded when an error occurs therein is stored in the binary memory 80 every two values per cell in the memory in order to make it possible to correctly perform reading and writing from and to the memory. According to the above-mentioned second embodiment, therefore, recording for a long time is possible by small memory capacity. Moreover, in the voice recording/reproducing device, the quality of the reproduced signal is not changed.

Although description was made of the embodiments in a case where the present invention is applied to the voice recording and reproducing device, the present invention is also applicable to a voice recording device or a voice reproducing device. Examples of the construction of the voice recording device include one obtained by removing the decoding means 30 and the A/D converter 60 from the devices shown in FIGS. 3 and 5. Further, examples of the construction of the voice reproducing device include one obtained by removing the coding means 10 and the D/A converter 50 from the devices shown in FIGS. 3 and 5.

If an IC card is used as the multi-valued memory 40 shown in FIG. 3 or the multi-valued memory 40 and the binary memory 80 shown in FIG. 5, and coded data are previously recorded in the IC card by the voice recording device, a voice can be reproduced by the IC card and the voice reproducing device. Therefore, the device is handy to carry.

In the above-mentioned embodiment, description was made of an example in which the data (the quantized value) having the low possibility that the quality of the reproduced signal is degraded when an error occurs therein out of the coded data is stored in the multi-valued memory 40 every three or more values per cell in the memory, and the data (the power value) having the high possibility that the quality of the reproduced signal is degraded when an error occurs therein out of the coded data is stored in the multi-valued memory 40 or the binary memory 80 every two values per cell in the memory.

Even when voice data to be reproduced and control data for controlling the voice recording/reproducing device are stored in the memory in the voice recording/reproducing device, however, it is possible to carry out similar write control and read control.

Description is now made of a case where an incoming message (ICM) is stored in a multi-valued memory such as a flash memory in a message phone.

Figure 6:
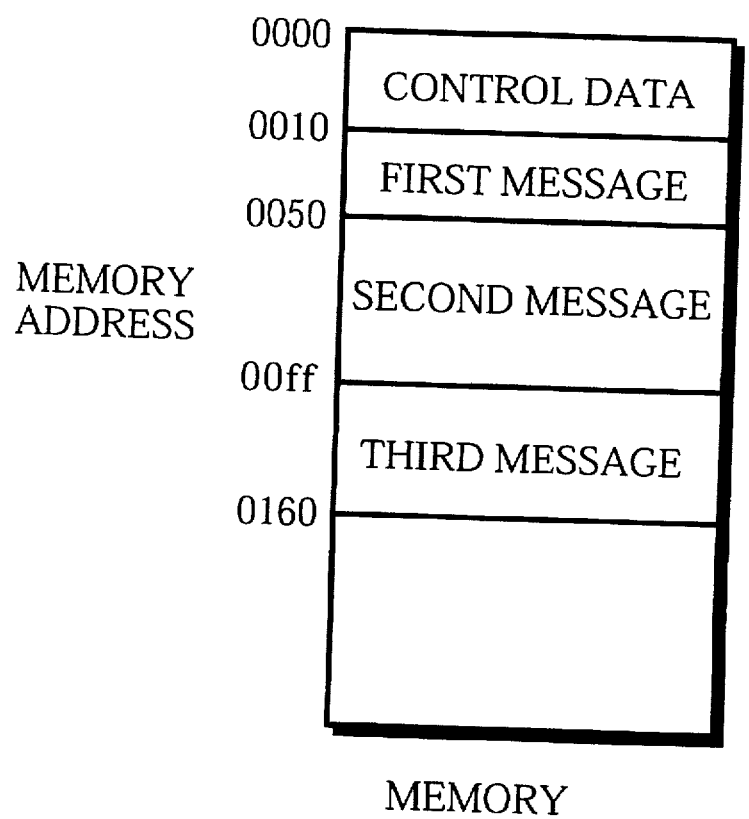
FIG. 6 is a typical diagram showing an example in which control data and a plurality of messages are stored in a multi-valued memory.

When the first message from a calling party is recorded, the recording of voice data is started at a predetermined address in the multi-valued memory. When the second message is recorded, the recording of voice data is started at an address succeeding the final address in which the first message has been recorded in the multi-valued memory. However, the respective messages differ in the length. In order to store the second and the subsequent messages in the multi-valued memory, the final address storing the preceding message must be stored as control data. That is, the control data and the respective messages must be stored in the multi-valued memory, as shown in FIG. 6.

In the voice recording/reproducing device in which the voice data and the control data are stored in the multi-valued memory, voice data having the low possibility that the voice recording device is erroneously operated when an error occurs therein is stored in the multi-valued memory every three or more values per cell in the memory. On the other hand, control data having the high possibility that the voice recording device is erroneously operated when an error occurs therein is stored in the multi-valued memory every two values per cell in the memory.

Description is now made of an area assigning method in a case where a plurality of types of data are stored in the multi-valued memory 40.

Figure 7:
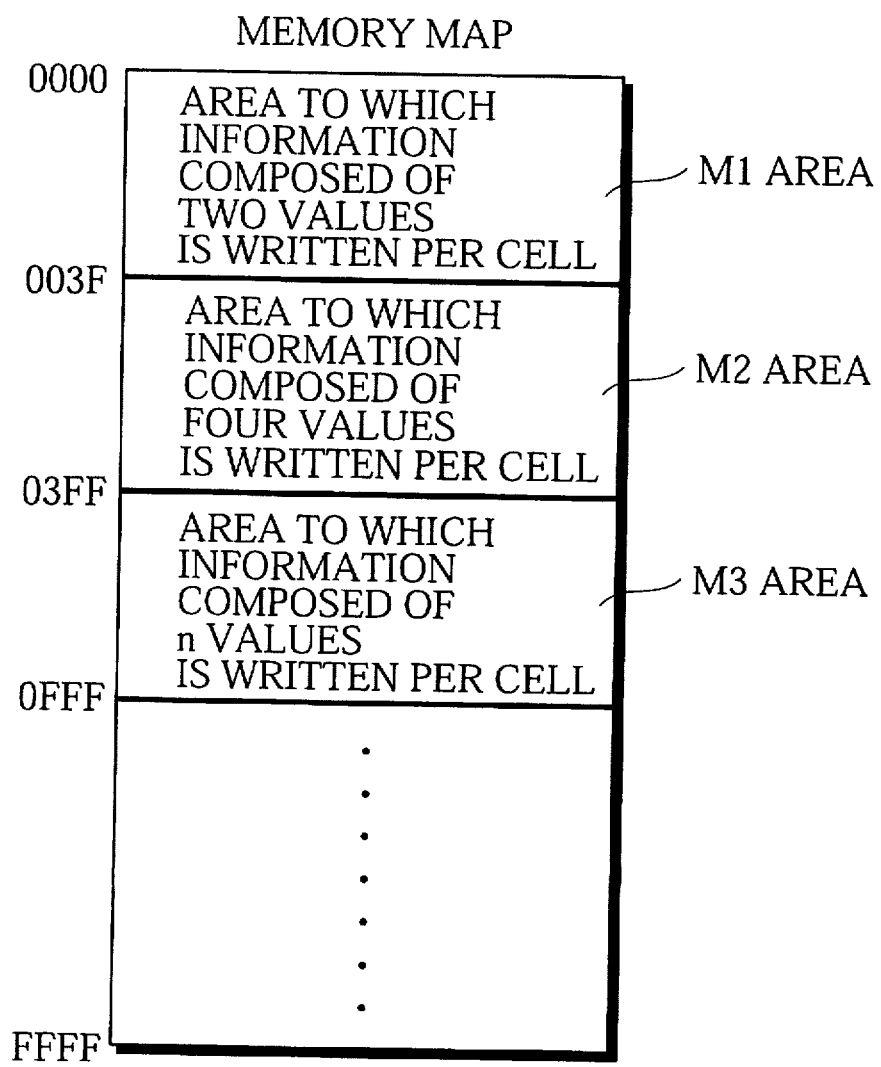
FIG. 7 is a typical diagram showing a method of assigning areas in the multi-valued memory.

FIG. 7 illustrates a first area assigning method.

As shown in FIG. 7, a memory area of the multi-valued memory 40 is previously divided into an M1 area to which information composed of two values is written per cell, an M2 area to which information composed of four values is written per cell, and an M3 area to which information composed of n (where n is an integer of not less than five) values is written per cell.

Data having the highest possibility that the reproduced signal is degraded or having the highest possibility that the voice recording/reproducing device is erroneously operated when an error occurs therein is stored in the M1 area every two values per cell, data having the second highest possibility that the reproduced signal is degraded or having the second highest possibility that the voice recording/ reproducing device is erroneously operated when an error occurs therein is stored in the M2 area every four values per cell, and data having the next highest possibility that the reproduced signal is degraded or having the next highest possibility that the voice recording/reproducing device is erroneously operated when an error occurs therein is stored in the M3 area every five or more values per cell.

Figure 8:
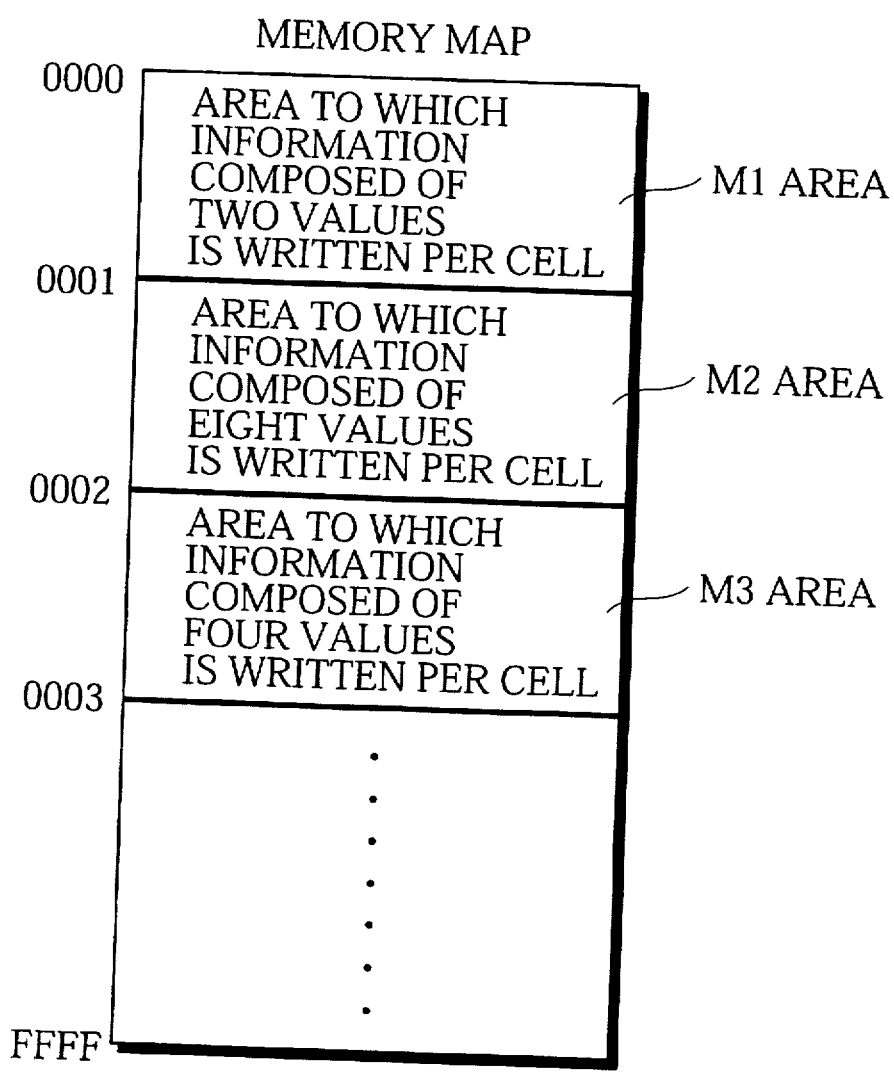
FIG. 8 is a typical diagram showing another method of assigning areas in the multi-valued memory.

FIG. 8 illustrates a second area assigning method.

In this example, when a plurality of types of data which differ in the possibility that the reproduced signal is degraded or the possibility that the voice recording/ reproducing device is erroneously operated when an error occurs therein are written to the multi-valued memory, data to be written are written to the multi-valued memory every time the data is produced in the order of addresses corresponding to the order of production.

Figure 9:
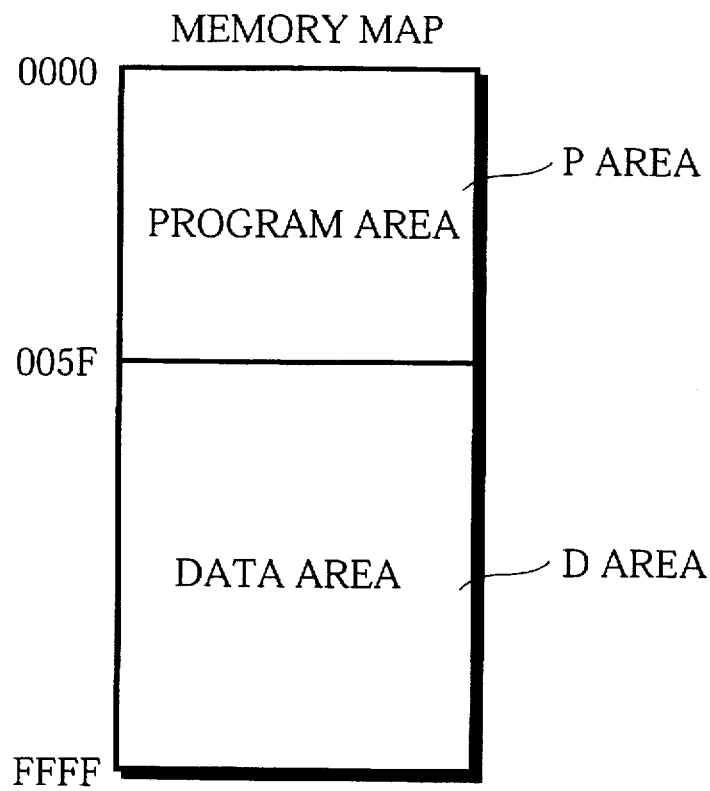
FIG. 9 is a typical diagram showing still another method of assigning areas in the multi-valued memory.
Figure 10:
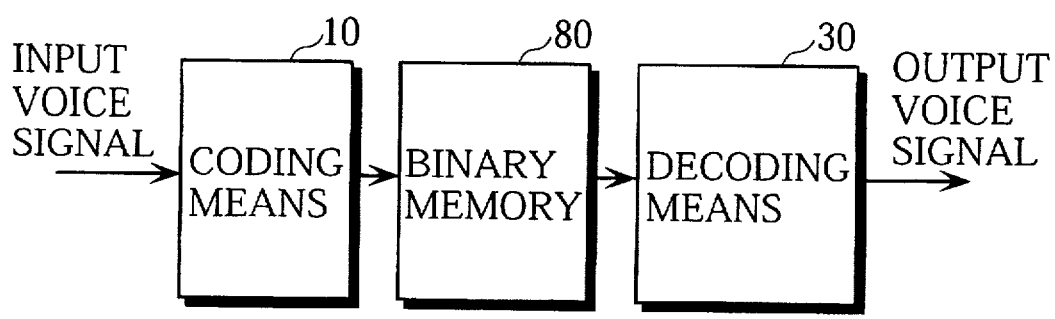
FIG. 10 is a block diagram showing the schematic construction of a conventional voice recording/reproducing device.

In storing in the multi-valued memory a program for producing coded data or control data for controlling operations of the voice recording/reproducing device, and data other than the program, such as coded data or control data which is produced by the program, it is preferable that an area P to which the program is written and an area D to which the data other than the program is written are previously set, as shown in FIG. 9.

In this case, in writing the data to the D area, it is possible to use the first assigning method or the second assigning method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data write control method for writing at least first data and second data to a storing means, wherein said storing means is a multi-valued memory to which information composed of two values can be stored per cell and information composed of three or more values can be also stored per cell, said method comprising the steps of:

applying one of said first data and said second data to said storing means for storage therein; and determining the amount of information to be stored per cell in said storing means depending on whether said first data is to be stored to said storing means or whether said second data is to be stored therein.

2. The data write control method according to claim 1, wherein said first data has a high possibility that the quality of a reproduced signal is degraded when an error occurs therein, and said second data has a low possibility that the quality of said reproduced signal is degraded when an error occurs therein, and the amount of information to be stored per cell in said storing means is determined when said first data and said second data are stored to the storing means so that the amount of information, which corresponds to the first data, to be written per cell in the storing means is smaller than the amount of information, which corresponds to the second data, to be stored per cell in the storing means.

3. The data write control method according to claim 2, wherein said data are a quantized value and a power value of each of band signals obtained when a voice signal is coded by a split band coding method, said first data being the power value of the band signal, said second data being the quantized value of the band signal.

4. The data write control method according to claim 1, wherein said first data has a high possibility that a signal reproducing device is erroneously operated when an error occurs therein, said second data has a low possibility that said signal reproducing device is erroneously operated when an error occurs therein, and the amount of information to be stored per cell in said storing means is controlled when said first data and said second data are stored to the storing means so that the amount of information, which corresponds to the first data, to be stored per cell in the storing means is smaller than the amount of information, which corresponds to the second data, to be stored per cell in the storing means.

5. The data write control method according to claim 1, wherein one of said first and second data is data to be reproduced, and the other data is control data, and the amount of information to be stored per cell in said storing means is determined when said data to be reproduced and said control data are stored to the storing means so that the amount of information, which corresponds to the control data, to be stored per cell in the storing means is smaller than the amount of information, which corresponds to the data to be reproduced, to be stored per cell in the storing means.

6. A data read control method for reading out from storing means at least first data and second data stored therein, wherein said storing means is a multi-valued memory to which information composed of two values can be stored per cell and information composed of three or more values can be also stored per cell, said method comprising the steps of:

determining whether said first data or said second data are stored in said storing means based upon the amount of information stored in a cell of said storing means; and reading out information from said cell of said storing means as said first data or said second data depending on a determination made in said determining step.

7. The data read control method according to claim 6, wherein said first data has a high possibility that the quality of a reproduced signal is degraded when an error occurs therein, and said second data has a low possibility that the quality of said reproduced signal is degraded when an error occurs therein, said first data and said second data are stored to said storing means so that the amount of information, which corresponds to the first data, to be stored per cell in the storing means is smaller than the amount of information, which corresponds to the second data, to be stored per cell in the storing means, and the amount of information to be read out per cell in said storing means is determined when said first data and said second data are read out from the storing means depending on the amount of information, which corresponds to each of the data, to be stored per cell in the storing means.

8. The data read control method according to claim 7, wherein said data are a quantized value and a power value of each of band signals obtained when a voice signal is coded by a split band coding method, said first data being the power value of the band signal, said second data being the quantized value of the band signal.

9. The data read control method according to claim 6, wherein said first data has a high possibility that a signal reproducing device is erroneously operated when an error occurs therein, said second data has a low possibility that the said signal reproducing device is erroneously operated when an error occurs therein, said first data and said second data are stored to said storing means so that the amount of information, which corresponds to the first data, to be stored per cell in the storing means is smaller than the amount of information, which corresponds to the second data, to be stored per cell in the storing means, and the amount of information to be read out per cell in said storing means is determined when said first data and said second data are read out from the storing means depending on the amount of information, which corresponds to each of the data, to be stored per cell in the storing means.

10. The data read control method according to claim 6, wherein one of said first and second data is data to be reproduced, and the other data is control data, said control data and said data to be reproduced are stored to said storing means so that the amount of information, which corresponds to the control data, to be stored per cell in the storing means is smaller than the amount of information, which corresponds to the data to be reproduced, to be stored per cell in the storing means, and the amount of information to be read out per cell in said storing means is determined when said data to be reproduced and said control data are read out from the storing means depending on the amount of information, which corresponds to each of the data, to be stored per cell in the storing means.

11. A data write/read control method for writing at least first data and second data to a storing means and reading out said first and second data from said storing means, wherein said storing means is a multi-valued memory to which information composed of two values can be stored per cell and information composed of three or more values can be also stored per cell, said method comprising the steps of:

controlling the amount of information to be stored in a cell in said storing means is depending whether said first data are to be stored in said cell or whether said second data are to be stored in said cell, and reading out an amount of information from a cell of said storing means depending on whether said first data or said second data is to be read our from said cell of said storing means.

12. The data write/read control method according to claim 11, wherein said first data has a high possibility that the quality of a reproduced signal is degraded when an error occurs therein, and said second data has a low possibility that the quality of said reproduced signal is degraded when an error occurs therein, the amount of information to be stored per cell in said storing means is determined when said first data and said second data are stored to the storing means so that the amount of information, which corresponds to the first data, to be stored per cell in the storing means is smaller than the amount of information, which corresponds to the second data, to be stored per cell in the storing means, and the amount of information to be read out per cell in said storing means is determined when said first data and said second data are read out from the storing means depending on the amount of information, which corresponds to each of the data, to be stored per cell in the storing means.

13. The data write/read control method according to claim 12, wherein said data are a quantized value and a power value of each of band signals obtained when a voice signal is coded by a split band coding method, said first data being the power value of the band signal, said second data being the quantized value of the based signal.

14. The data write/read control method according to claim 11, wherein said first data has a high possibility that a signal reproducing device is erroneously operated when an error occurs therein, said second data has a low possibility that said signal reproducing device is erroneously operated when an error occurs therein, the amount of information to be stored per cell in said storing means is determined when said first data and said second data are stored to the storing means so that the amount of information, which corresponds to the first data, to be stored per cell in the storing means is smaller than the amount of information, which corresponds to the second data, to be stored per cell in the storing means, and the amount of information to be read out per cell in said storing means is determined when said first data and said second data are read out from the storing means depending on the amount of information, which corresponds to each of the data, to be stored per cell in the storing means.

15. The data write/read control method according to claim 11, wherein one of said first and second data is data to be reproduced, and the other data is control data, the amount of information to be stored per cell in said storing means is determined when said data to be reproduced and said control data are stored to the storing means so that the amount of information, which corresponds to the control data, to be stored per cell in the storing means is smaller than the amount of information, which corresponds to the data to be reproduced, to be stored per cell in the storing means, and the amount of information to be read out per cell in said storing means is determined when said data to be reproduced and said control data are read out from the storing means depending on the amount of information, which corresponds to each of the data to be stored per cell in the storing means.

16. A data write control method for writing at least first data and second data to a storing means, wherein said storing means comprises a multi-valued memory to which information composed of three or more values is stored per cell and a binary memory to which information composed of two values is stored per cell, said method comprising the steps of:

determining whether said first data or said second data is to be stored in said storing means; and selecting one of said multi-valued memory and said binary memory depending on a determination made in said determining step.

17. The data write control method according to claim 16, wherein said first data has a high possibility that the quality of a reproduced signal is degraded when an error occurs therein, said second data has a low possibility that the quality of the reproduced signal is degraded when an error occurs therein, and said binary memory is selected when said first data is stored to said storing means, and said multi-valued memory is selected when said second data is stored to said storing means.

18. The data write control method according to claim 17, wherein said data are a quantized value and a power value of each of band signals obtained when a voice signal is coded by a split band coding method, said first data being the power value of the band signal, said second data being the quantized value of the band signal.

19. The data write control method according to claim 16, wherein said first data has a high possibility that a signal reproducing device is erroneously operated when an error occurs therein, said second data has a low possibility that said signal reproducing device is erroneously operated when an error occurs therein, and said binary memory is selected when said first data is stored to said storing means, and said multi-valued memory is selected when said second data is stored to said storing means.

20. The data write control method according to claim 16, wherein one of said first and second data is data to be reproduced, and the other data is control data, and said multi-valued memory is selected when said data to be reproduced is stored to said storing means, and said binary memory is selected when said control data is stored to said storing means.

21. A data read control method for reading out at least first data and second data stored in a storing means, wherein said storing means comprises a multi-valued memory to which information composed of three or more values is stored per cell and a binary memory to which information composed of two values is stored per cell, said method comprising the steps of:

selecting one of said multi-valued memory and said binary memory depending on whether said first data or said second data are to be read out from said storing means; and reading out information from a cell of said storing means as said first data or said second data depending on a selection made in said selecting step.

22. The data read control method according to claim 21, wherein said first data has a high possibility that the quality of a reproduced signal is degraded when an error occurs therein, said second data has a low possibility that the quality of said reproduced signal is degraded when an error occurs therein, said second data is stored to said multi-valued memory, and said first data is stored to said binary memory, and said binary memory is selected when said first data is read out from said storing means, and said multi-valued memory is selected when said second data is read out from said storing means.

23. The data read control method according to claim 22, wherein said data are a quantized value and a power value of each of band signals obtained when a voice signal is coded by a split band coding method, said first data being the power value of the band signal, said second data being the quantized value of the band signal.

24. The data read control method according to claim 21, wherein said first data has a high possibility that a signal reproducing device is erroneously operated when an error occurs therein, said second data has a low possibility that said signal reproducing device is erroneously operated when an error occurs therein, said second data is stored to said multi-valued memory, and said first data is stored to said binary memory, and said binary memory is selected when said first data is read out from said storing means, and said multi-valued memory is selected when said data is read out from said storing means.

25. The data read control method according to claim 21, wherein one of said first and second data is data to be reproduced, and the other data is control data, said data to be reproduced is stored to said multi-valued memory, and said control data is stored to said binary memory, and said multi-valued memory is selected when said data to be reproduced is read out from said storing means, and said binary memory is selected when said control data is read out from said storing means.

26. A data write/read control method for writing at least first and second data to storing means and reading out said first and second data from said storing means, wherein said storing means comprises a multi-valued memory to which information composed of three or more values is stored per cell and a binary memory to which information composed of two values is stored per cell, said method comprising the steps of:

selecting one of said multi-valued memory and said binary memory for storage of data therein depending on whether said first data or said second data are to be stored to said storing means, and selecting one of said multi-valued memory and said binary memory for reading out of data therefrom depending on whether said first data or said second data is to be read out from said storing means.

27. The data write/read control method according to claim 21, wherein said first data has a high possibility that the quality of a reproduced signal is degraded when an error occurs therein, said second data has a low possibility that the quality of said reproduced signal is degraded when an error occurs therein, said binary memory is selected when said first data is stored to said storing means, and said multi-valued memory is selected when said second data is stored to said storing means, and said binary memory is selected when said first data is read out from said storing means, and said multi-valued memory is selected when said second data is read out from said storing means.

28. The data write/read control method according to claim 27, wherein said two types of data are a quantized value and a power value of each of band signals obtained when a voice signal is coded by a split band coding method, said first data being the power value of the band signal, said second data being the quantized value of the band signal.

29. The data write/read control method according to claim 26, wherein said first data has a high possibility that a signal reproducing device is erroneously operated when an error occurs therein, said second data has a low possibility that said signal reproducing device is erroneously operated when an error occurs therein, said binary memory is selected when said first data is stored to said storing means, and said multi-valued memory is selected when said second data is stored to said storing means, and said binary memory is selected when said first data is read out from said storing means, and said multi-valued memory is selected when said second data is read out from said storing means.

30. The data write/read control method according to claim 26, wherein one of said first and second data is data to be reproduced, and the other data is control data, said multi-valued memory is selected when said data to be reproduced is stored to said storing means, and said binary memory is selected when said control data is stored to said storing means, and said multi-valued memory is selected when said data to be reproduced is read out from said storing means, and said binary memory is selected when said control data is read out from said storing means.

31. A data write control method for writing at least first and second data to storing means comprising the steps of:

judging whether inputted data is said first data or said second data, storing an amount of inputted data per cell in said storing means according to a mode that is determined based upon whether the inputted data is judged to be said first data or said second data, and storing the data per cell in said storing means depending upon the determined storing mode.

32. The data write control method according to claim 31, wherein the mode of storing the data includes a first mode in which three or more values are stored per cell and a second mode in which two values are stored per cell.

33. A data read control method for reading out at least first and second data from storing means comprising the steps of:

determining a mode which determined the amount of data that was stored based upon the data read out from said storing means, and converting the data read out from said storing means depending upon the judged storing mode into reproduced data.

34. The data read control method according to claim 33, wherein the mode of storing data includes a first mode in which three or more values are stored per cell and a second mode in which two values are stored per cell.

35. A data write/read control method for writing at least first and second data to storing means and reading out said data from said storing means, comprising the steps of:

judging whether inputted data is said first data or said second data, storing an amount of inputted data per cell in said storing means according to a mode that is determined based upon whether the inputted data is judged to be said first or said second data, storing the data per cell in said storing means depending upon the determined storing mode, and wherein the mode of storing the data is judged based upon the data read out from said storing means, and the data read out from said storing means depending upon the judged storing mode is converted into reproduced data.

36. The data write/read control method according to claim 35, wherein the mode of storing the data includes a first mode in which three or more values are stored per cell and a second mode in which two values are stored per cell.

37. A data control apparatus for handling at least two types of data, said data including first data and second data that is different from said first data, said apparatus comprising:

a multi-value storing means having plural cells to which information composed of two values and information composed of three or more values can be stored per cell;

means for providing said first data and said second data; and a control means for selectively controlling storage of said first data and said second data in said storing means, said control means determining whether said information composed of two values or said information composed of three or more values is to be stored in one of said plural cells based upon whether such information belongs to said first data or said second data, and said control means causing reading out of information from one of said plural cells as said first data or said second data based upon the amount of such information stored in said one cell.

38. A data control apparatus according to claim 37, wherein said storing means includes a multi-valued memory and a binary memory.

* * * * *